United States Patent
Edwards et al.

(10) Patent No.: US 9,082,905 B2
(45) Date of Patent: Jul. 14, 2015

(54) PHOTODIODE EMPLOYING SURFACE GRATING TO ENHANCE SENSITIVITY

(71) Applicant: Texas Instruments Incorporated, Dallas, TX (US)

(72) Inventors: Henry Litzmann Edwards, Garland, TX (US); Dimitar Trifonov Trifonov, Vail, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/768,037

(22) Filed: Feb. 15, 2013

(65) Prior Publication Data

US 2013/0207168 A1  Aug. 15, 2013

Related U.S. Application Data

(60) Provisional application No. 61/599,299, filed on Feb. 15, 2012.

(51) Int. Cl.
| | |
|---|---|
| *H01L 31/062* | (2012.01) |
| *H01L 31/0236* | (2006.01) |
| *H01L 31/0216* | (2014.01) |
| *H01L 31/0232* | (2014.01) |
| *H01L 31/103* | (2006.01) |

(52) U.S. Cl.
CPC .... *H01L 31/02366* (2013.01); *H01L 31/02161* (2013.01); *H01L 31/02327* (2013.01); *H01L 31/103* (2013.01)

(58) Field of Classification Search
None
See application file for complete search history.

(56) References Cited

U.S. PATENT DOCUMENTS

| | | | | |
|---|---|---|---|---|
| 5,652,689 | A * | 7/1997 | Yuan | 361/56 |
| 5,882,993 | A * | 3/1999 | Gardner et al. | 438/591 |
| 2001/0023095 | A1* | 9/2001 | Kopley et al. | 438/200 |
| 2001/0053583 | A1* | 12/2001 | Fang et al. | 438/424 |
| 2003/0169360 | A1* | 9/2003 | Rhodes | 348/308 |
| 2004/0075110 | A1* | 4/2004 | Yaung et al. | 257/200 |

* cited by examiner

*Primary Examiner* — Kyoung Lee
(74) *Attorney, Agent, or Firm* — Jacqueline J. Garner; Frank D. Cimino

(57) ABSTRACT

A semiconductor device contains a photodiode formed in a substrate of the semiconductor device. At a top surface of the substrate, over the photodiode, a surface grating of periodic field oxide in a periodic configuration and/or gate structures in a periodic configuration is formed. The field oxide may be formed using an STI process or a LOCOS process. A semiconductor device with a surface grating including both field oxide and gate structures has the gate structures over the semiconductor substrate, between the field oxide. The surface grating has a pitch length up to 3 microns. The surface grating covers at least half of the photodiode.

20 Claims, 9 Drawing Sheets

PHOTODIODE EMPLOYING SURFACE GRATING TO ENHANCE SENSITIVITY

CROSS-REFERENCE TO RELATED APPLICATIONS

This application claims the benefit of priority under U.S.C. §119(e) of U.S. Provisional Application 61/599,299, filed Feb. 15, 2012.

FIELD OF THE INVENTION

This invention relates to the field of semiconductor devices. More particularly, this invention relates to photodiodes in semiconductor devices.

BACKGROUND OF THE INVENTION

A photodiode in a semiconductor device may receive incident light through a top surface of the semiconductor device and covert the light into a signal current. A portion of the incident light may be undesirably lost at the top surface, due to reflection. Dielectric antireflection layers such as magnesium fluoride may be deposited on the top surface, but may undesirably increase fabrication cost and complexity of the semiconductor device.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device contains a photodiode formed in a substrate of the semiconductor device. At a top surface of the substrate, over the photodiode, a surface grating of periodic field oxide and/or gate structures is formed. The surface grating has a pitch length up to 3 microns. The surface grating covers at least half of the photodiode.

DETAILED DESCRIPTION OF EXAMPLE EMBODIMENTS

The following applications contains related materials and are hereby incorporated in their entirety: Application 61/599,277 entitled "LOW-CAPACITANCE PHOTODIODE UTILIZING VERTICAL CARRIER CONFINEMENT" and Application 61/599,286 entitled "WAVELENGTH SENSITIVE PHOTODIODE EMPLOYING SHORTED JUNCTION" filed concurrently with this application.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device contains a photodiode formed in a substrate of the semiconductor device. At a top surface of the substrate, over the photodiode, a surface grating of periodic field oxide in a periodic configuration and/or gate structures in a periodic configuration is formed. Spaces between the field oxide are occupied by semiconductor material of the substrate. The field oxide may be formed using a shallow trench isolation (STI) process or a local oxidation of silicon (LOCOS) process. A semiconductor device with a surface grating including both field oxide and gate structures has the gate structures over the semiconductor substrate, between the field oxide. The surface grating has a pitch length up to 3 microns. The surface grating covers at least half of the photodiode. A surface grating having both field oxide and gate structures may advantageously provide reduced reflection of incident light in a wavelength band of 700 nanometers to 1000 nanometers. A surface grating having field oxide, and free of a gate structure periodic configuration, may advantageously provide reduced reflection of incident light in a wavelength band of 450 nanometers to 700 nanometers. A surface grating having a gate structure periodic configuration, and free of a field oxide periodic configuration, may advantageously provide reduced reflection of incident light in a wavelength band of 300 nanometers to 500 nanometers.

Figure 1:
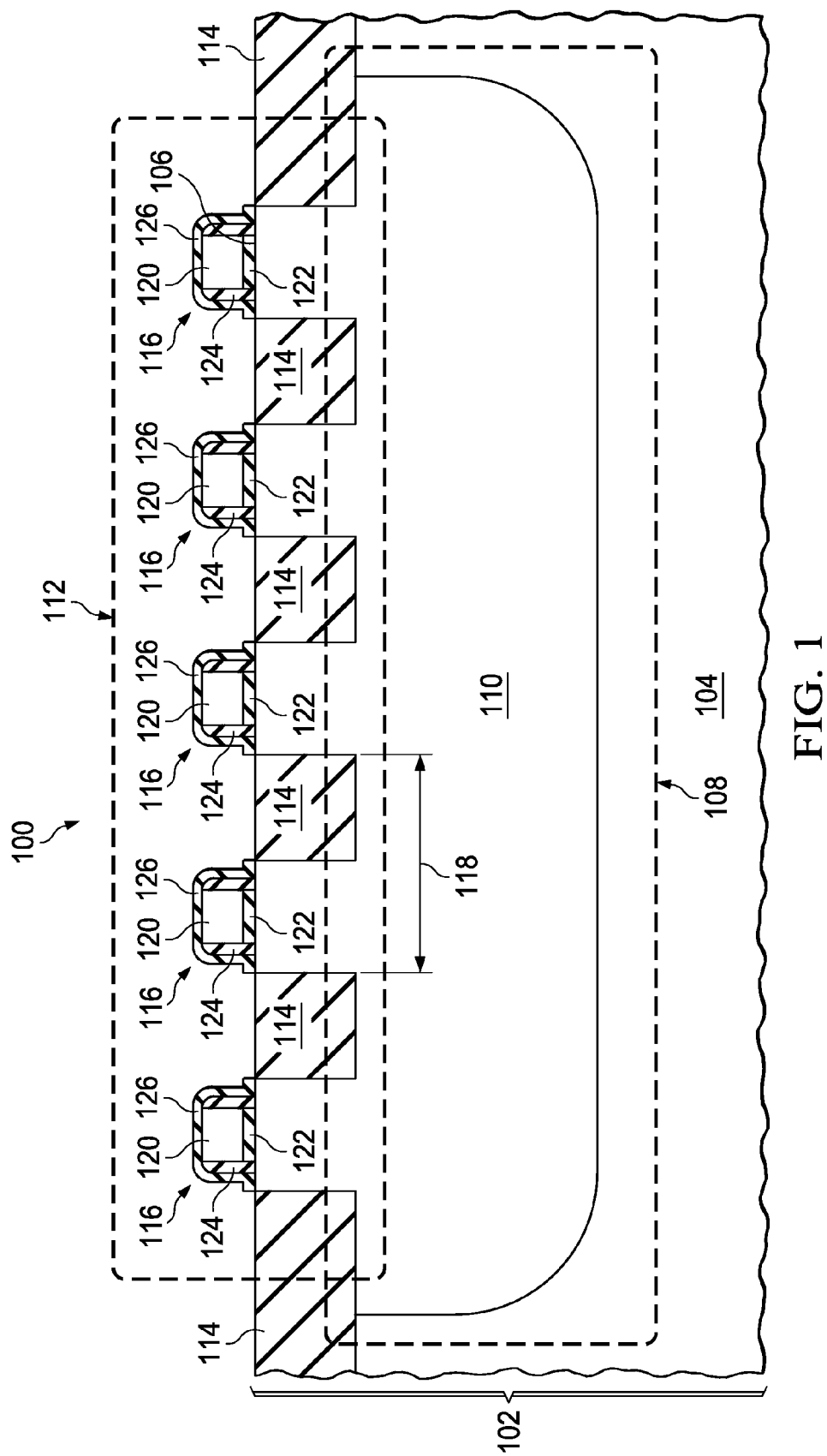
FIG. 1 through FIG. 4 are cross sections of semiconductor devices containing photodiodes with exemplary surface gratings over the photodiodes.

FIG. 1 through FIG. 4 are cross sections of semiconductor devices containing photodiodes with exemplary surface gratings over the photodiodes. Referring to FIG. 1, a semiconductor device 100 is formed in and on a substrate 102 which includes semiconductor material 104 extending to a top surface 106 of the substrate 102. A photodiode 108 is formed in the semiconductor material 104, depicted in FIG. 1 as a p-n junction 110. A surface grating 112 is formed at the top surface 106 of the substrate 102 over at least half of the photodiode 108. In the instant embodiment, the surface grating 112 includes elements of field oxide 114 in a periodic configuration and gate structures 116 in a periodic configuration. A pitch length 118 of the surface grating 112 is not more than 3 microns. In one version of the instant example, the pitch length 118 of the surface grating 112 is not more than 2 microns. In a further version of the instant example, the pitch length 118 is not more than 1 micron. The gate structures 116 are located on the semiconductor material 104 between the elements of field oxide 114.

In the instant example, the field oxide 114 is formed using an STI process. An exemplary STI process includes etching trenches, commonly 200 to 500 nanometers deep, into the substrate 102, growing a thermal oxide layer on sidewalls of the trenches, and filling the trenches with dielectric material, typically silicon dioxide, commonly by a high density plasma (HDP) process or an ozone based thermal chemical vapor deposition (CVD) process, also known as the high aspect ratio process (HARP). Unwanted dielectric material from the trench fill step may be removed from over the substrate 102 between the field oxide 114 using a chemical mechanical polish (CMP) process. Field oxide 114 formed by an STI process has tapered sidewalls in the substrate 102 and more than 75 percent of the field oxide 114 is below the top surface 106 of the substrate 102. Forming the surface grating 112 to include the field oxide 114 formed by an STI process may advantageously provide thicker field oxide and hence reduced reflection of incident light at values of the pitch length 118 below 2 microns.

The gate structures 116 include gates 120 and may further include gate dielectric layers 122, gate sidewall spacers 124 and/or a silicide block layer 126. The gates 120 may be primarily polycrystalline silicon, also known as polysilicon, with a thickness of, for example, 50 nanometers to 500 nanometers. The gate dielectric layers 122 may be primarily silicon dioxide, with a thickness of, for example, 1 nanometer to 50 nanometers. Instances of the semiconductor device 100 having transistors designed to operate at voltages above 20 volts may have gate dielectric layers 122 thicker than 50 nanometers. The gate sidewall spacers 124 may include one or more layers of dielectric material such as silicon nitride, silicon oxynitride and/or silicon dioxide. A lateral thickness of the gate sidewall spacers 124 may be, for example, one third to three fourths the thickness of the gates 120. The gates 120, gate dielectric layers 122 and gate sidewall spacers 124 may be similar to gate structures of metal oxide semiconductor (MOS) transistors contained in the semiconductor device 100. The silicide block layer 126 may include one or more layers of nitride, silicon oxynitride and/or silicon dioxide. The silicide block layer 126 may be, for example, 10 to 100 nanometers thick. In one version of the instant example, the gate structures 116 may be essentially free of metal features such as metal silicide. In the instant example, the silicide block layer 126 does not extend over the field oxide 114. Forming the surface grating 112 to include both the field oxide 114 and the gate structures 116 in a periodic configuration may advantageously provide reduced reflection of incident light to the photodiode 108 in a wavelength band of 700 nanometers to 1000 nanometers.

Figure 2:
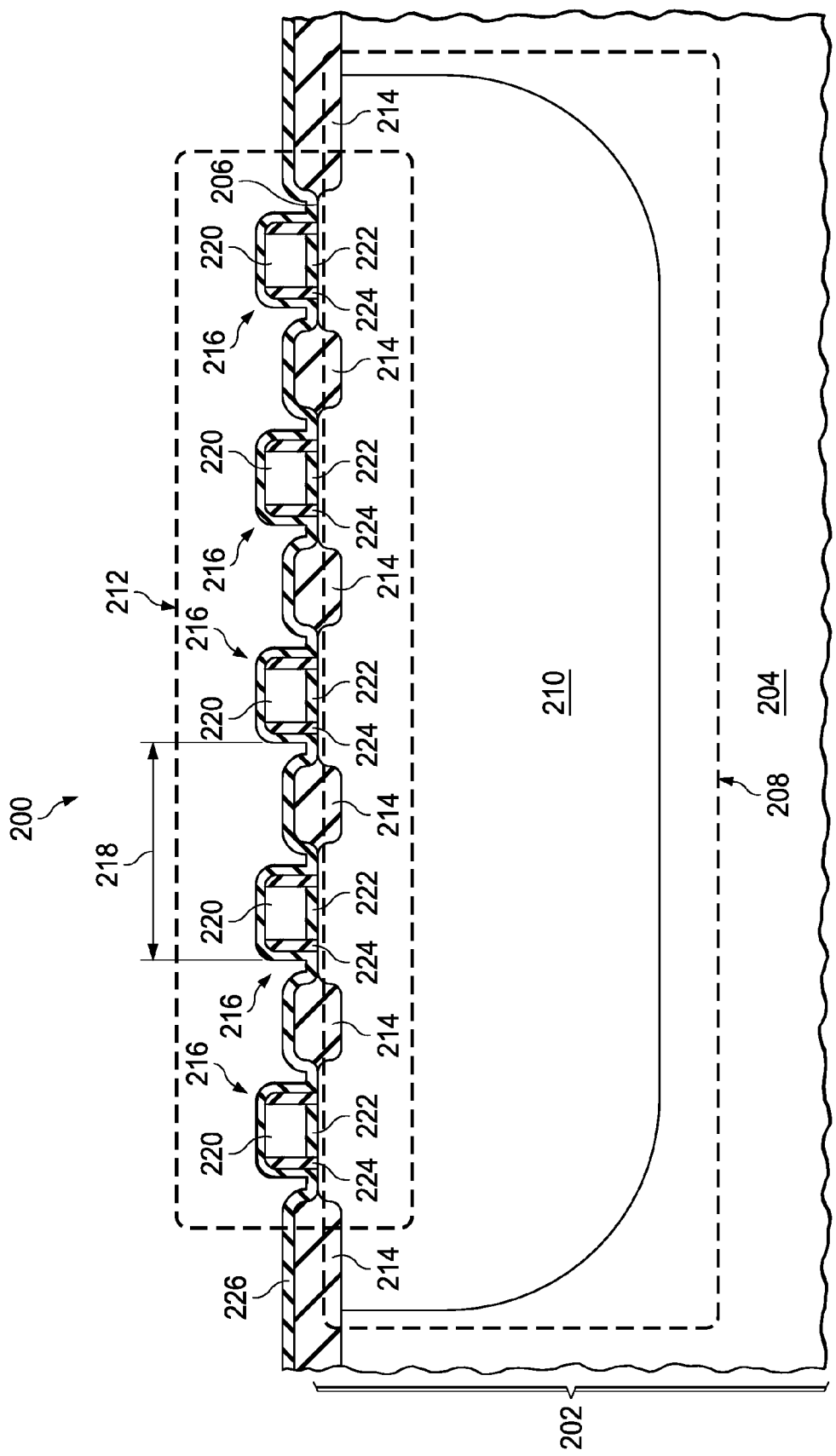

Referring to FIG. 2, a semiconductor device 200 is formed in and on a substrate 202 which includes semiconductor material 204 extending to a top surface 206 of the substrate 202. A photodiode 208 is formed in the semiconductor material 204, depicted in FIG. 2 as a p-n junction 210. A surface grating 212 is formed at the top surface 206 of the substrate 202 over at least half of the photodiode 208. In the instant embodiment, the surface grating 212 includes elements of field oxide 214 in a periodic configuration and gate structures 216 in a periodic configuration. A pitch length 218 of the surface grating 212 is not more than 3 microns. In one version of the instant example, the pitch length 218 of the surface grating 212 is not more than 2 microns. In a further version of the instant example, the pitch length 218 is not more than 1 micron. The gate structures 216 are located on the semiconductor material 204 between the field oxide 214.

In the instant example, the field oxide 214 is formed using a LOCOS process. An exemplary LOCOS process includes patterning a silicon nitride layer over the top surface 206 of the substrate 202 to expose areas for the field oxide 214, growing thermal oxide in the exposed areas and subsequently removing the silicon nitride layer. Field oxide 214 formed by a LOCOS process has tapered edges abutting the semiconductor material 204 of the substrate 202. The gate structures 216 include gates 220 and may further include gate dielectric layers 222, gate sidewall spacers 224 and/or a silicide block layer 226. In the instant example, the silicide block layer 226 may extend over the field oxide 214.

Forming the surface grating 212 to include the field oxide 214 formed by a LOCOS process may reduce diffraction of incident light at angles higher than 45 degrees due to the tapered edges of the field oxide 214 and hence advantageously increase a portion of the incident light converted by the photodiode 208 into signal current. Forming the surface grating 212 to include both the field oxide 214 and the gate structures 216 in a periodic configuration may advantageously provide reduced reflection of incident light to the photodiode 208 in a wavelength band of 700 nanometers to 1000 nanometers.

Figure 3:
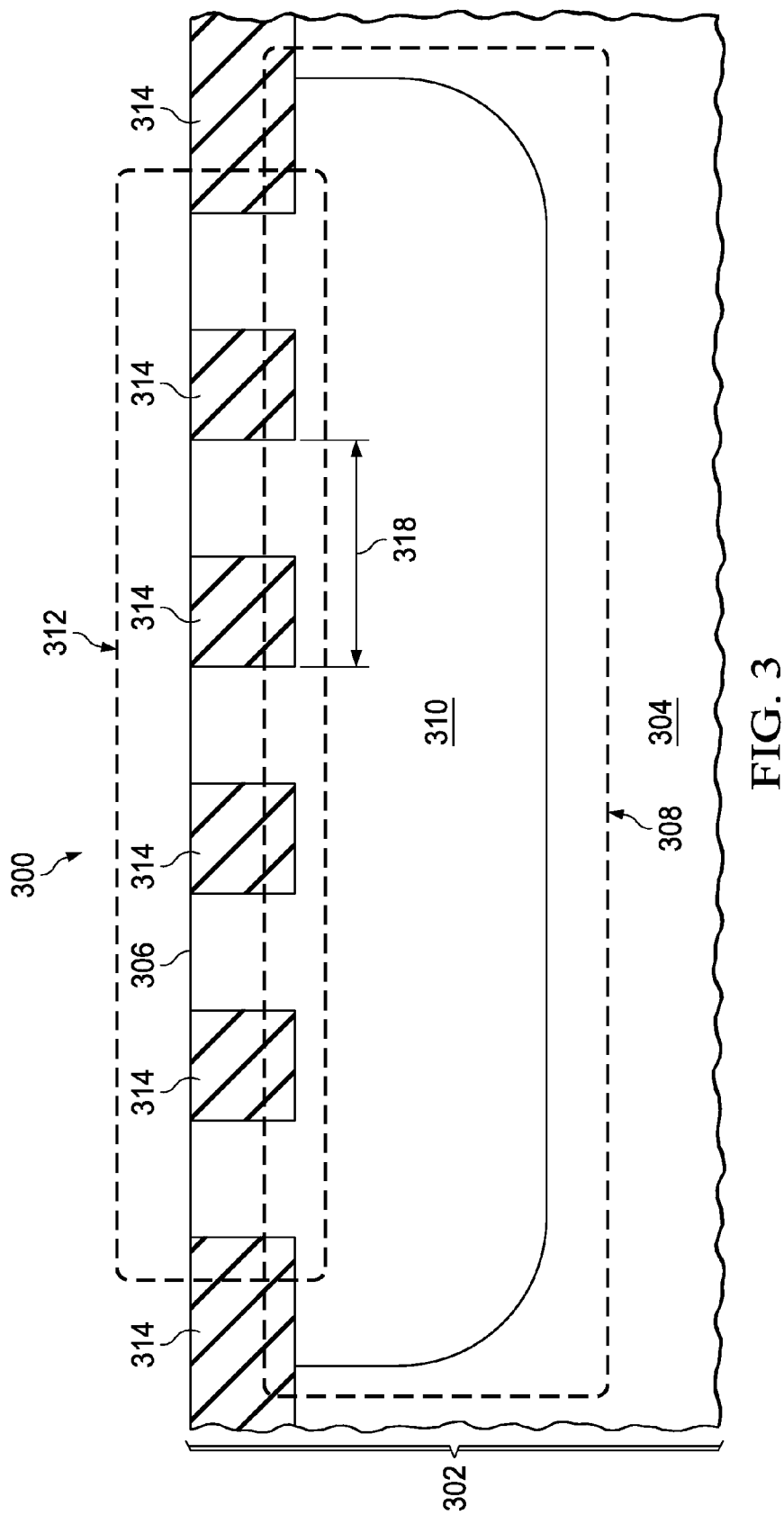

Referring to FIG. 3, a semiconductor device 300 is formed in and on a substrate 302 which includes semiconductor material 304 extending to a top surface 306 of the substrate 302. A photodiode 308 is formed in the semiconductor material 304, depicted in FIG. 3 as a p-n junction 310. A surface grating 312 is formed at the top surface 306 of the substrate 302 over at least half of the photodiode 308. In the instant embodiment, the surface grating 312 includes elements of field oxide 314 in a periodic configuration; the surface grating 312 is free of gate structures in a periodic configuration. A pitch length 318 of the surface grating 312 is not more than 3 microns. In one version of the instant example, the pitch length 318 is not more than 2 microns. In a further version, the pitch length 318 is not more than 1 micron. The field oxide 314 may be formed using an STI process as described in reference to FIG. 1 or using a LOCOS process as described in reference to FIG. 2. Forming the surface grating 312 to include only the field oxide 314 in a periodic configuration, and to be free of gate structures in a periodic configuration, may advantageously provide reduced reflection of incident light to the photodiode 308 in a wavelength band of 450 nanometers to 700 nanometers.

Figure 4:
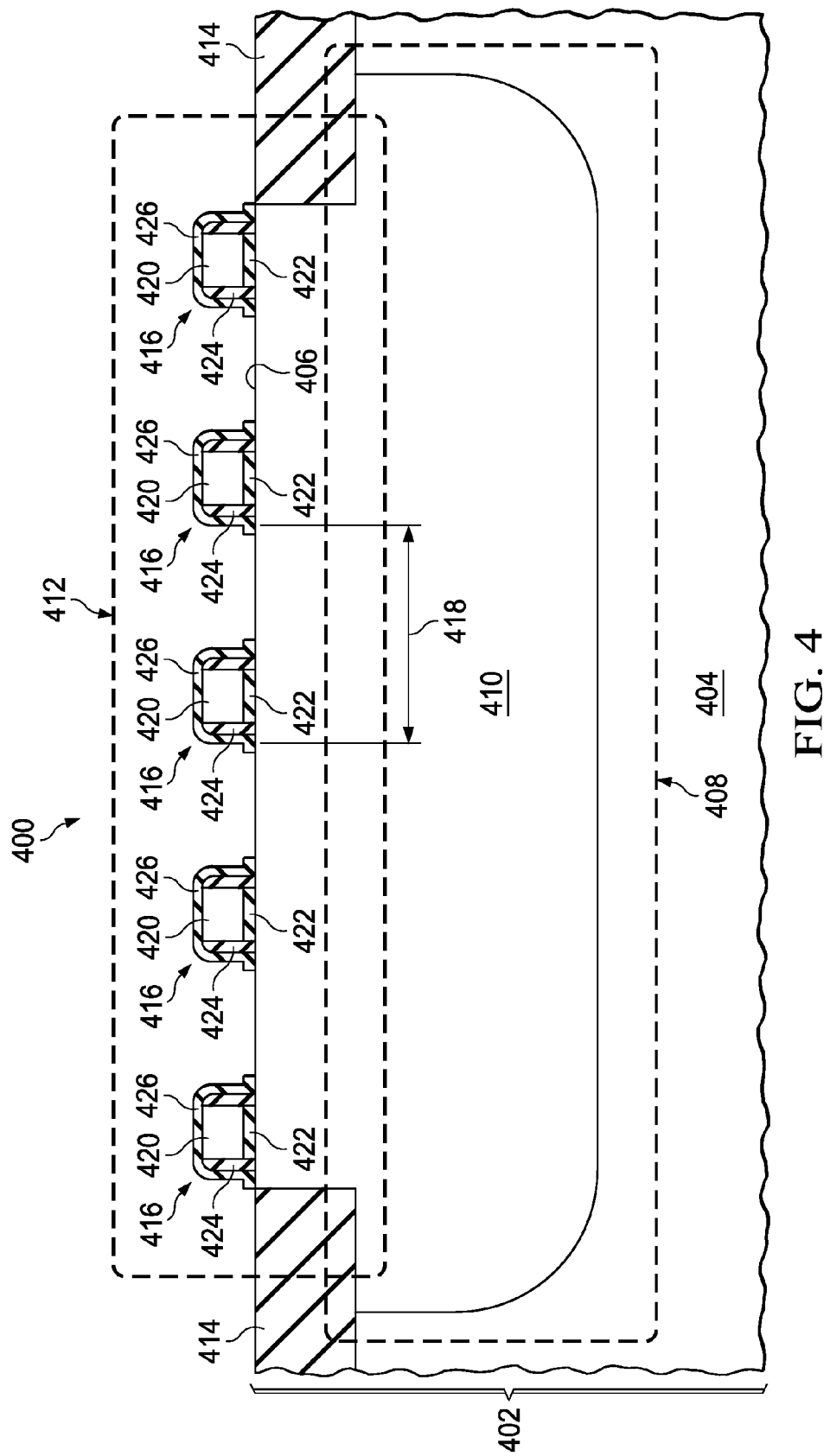

Referring to FIG. 4, a semiconductor device 400 is formed in and on a substrate 402 which includes semiconductor material 404 extending to a top surface 406 of the substrate 402. A photodiode 408 is formed in the semiconductor material 404, depicted in FIG. 4 as a p-n junction 410. The photodiode 408 may be laterally isolated in the semiconductor device 400 by field oxide 414. A surface grating 412 is formed at the top surface 406 of the substrate 402 over at least half of the photodiode 408. In the instant embodiment, the surface grating 412 includes gate structures 416 in a periodic configuration; the surface grating 412 is free of field oxide 414 in a periodic configuration. A pitch length 418 of the surface grating 412 is not more than 3 microns. In one version of the instant example, the pitch length 418 is not more than 2 microns. In a further version, the pitch length 418 is not more than 1 micron. Forming the surface grating 412 to include only the field oxide 414 in a periodic configuration, and to be free of gate structures in a periodic configuration, may advantageously provide reduced reflection of incident light to the photodiode 408 in a wavelength band of 500 nanometers to 500 nanometers.

Figure 5:
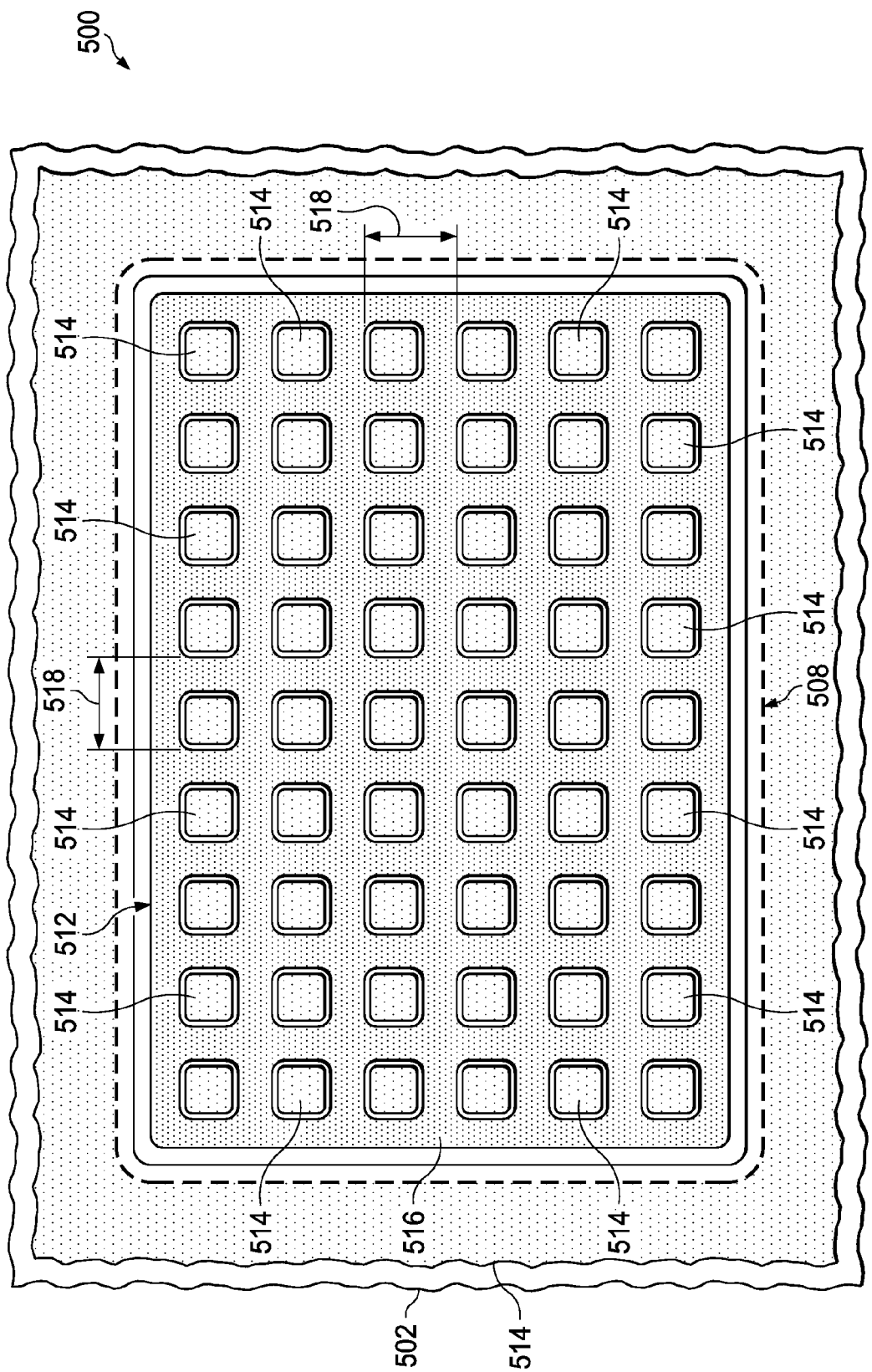
FIG. 5 through FIG. 9 are top views of semiconductor devices containing photodiodes with exemplary surface gratings over the photodiodes.

FIG. 5 through FIG. 9 are top views of semiconductor devices containing photodiodes with exemplary surface gratings over the photodiodes. Referring to FIG. 5, a semiconductor device 500 is formed in and on a substrate 502 which includes semiconductor material extending to a top surface of the substrate 502, as described in reference to FIG. 1. A photodiode 508 is formed in the semiconductor material. Field oxide 514 may be formed at the top surface of the substrate 502 surrounding the photodiode 508. A surface grating 512 is formed at the top surface of the substrate 502 over at least half of the photodiode 508. In the instant example, the surface grating 512 includes a two-dimensional array of semi-square elements of field oxide 514 and/or a two-dimensional grid of gate structure 516 between the field oxide 514. A pitch length 518 of the surface grating 512 in at least one of a horizontal direction and in a vertical direction is not more than 3 microns. In one version of the instant example, the pitch length 518 is not more than 2 microns. In a further version, the pitch length 518 is not more than 1 micron. The field oxide 514 may be formed using an STI process as described in reference to FIG. 1 or using a LOCOS process as described in reference to FIG. 2. The field oxide 514 is filled in FIG. 5 with a light stipple pattern. The grid of gate structure 516 is filled in FIG. 5 with a stipple pattern. In one version of the instant example, the surface grating 512 may include both the semi-square elements of field oxide 514 and the grid of gate structure 516. In another version of the instant example, the surface grating 512 may include the semi-square elements of field oxide 514 and be free of the grid of gate structure 516. In a further version of the instant example, the surface grating 512 may include the grid of gate structure 516 and be free of the semi-square elements of field oxide 514. Forming the surface grating 512 with a two-dimensional grid configuration may advantageously provide more uniform sensitivity of the photodiode 508 to incident light from different angles, by providing uniform diffraction of the incident light.

Figure 6:
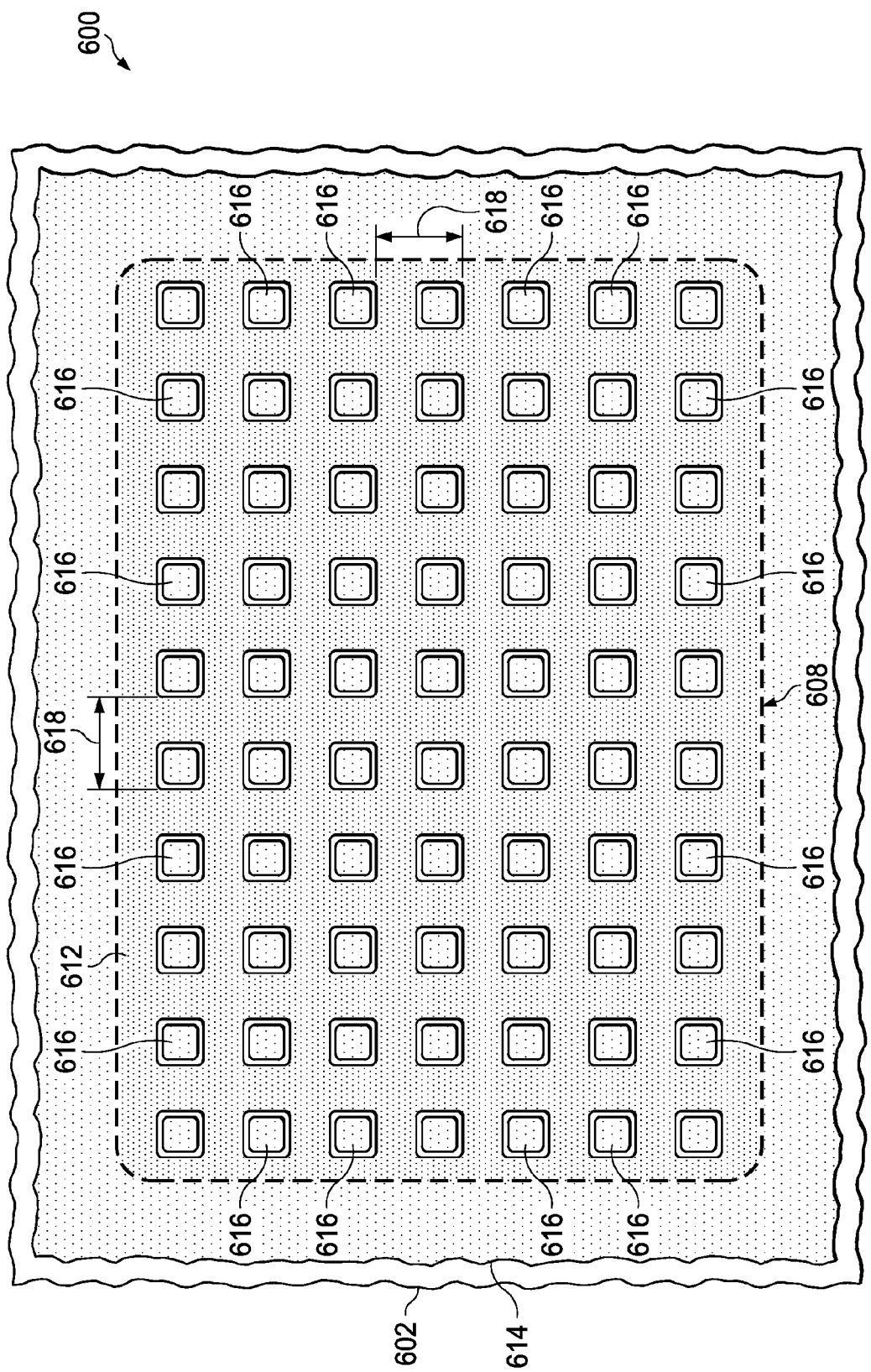

Referring to FIG. 6, a semiconductor device 600 is formed in and on a substrate 602 which includes semiconductor material extending to a top surface of the substrate 602, as described in reference to FIG. 1. A photodiode 608 is formed in the semiconductor material. Field oxide 614 may be formed at the top surface of the substrate 602 surrounding the photodiode 608. A surface grating 612 is formed at the top surface of the substrate 602 over at least half of the photodiode 608. In the instant example, the surface grating 612 includes a two-dimensional grid of field oxide 614 and/or a two-dimensional square array of semi-square elements of gate structure 616 between the field oxide 614. A pitch length 618 of the surface grating 612 in at least one of a horizontal direction and in a vertical direction is not more than 3 microns. In one version of the instant example, the pitch length 618 is not more than 2 microns. In a further version, the pitch length 618 is not more than 1 micron. The field oxide 614 may be formed using an STI process as described in reference to FIG. 1 or using a LOCOS process as described in reference to FIG. 2. The field oxide 614 is filled in FIG. 6 with a light stipple pattern. The square array of gate structures 616 is filled in FIG. 6 with a stipple pattern. In one version of the instant example, the surface grating 612 may include both the grid of field oxide 614 and the semi-square elements of gate structure 616. In another version of the instant example, the surface grating 612 may include the grid of field oxide 614 and be free of the semi-square elements of gate structure 616. In a further version of the instant example, the surface grating 612 may include the semi-square elements of gate structure 616 and be free of the grid of field oxide 614. Forming the surface grating 612 with a two-dimensional grid and square array configuration may advantageously provide more uniform sensitivity of the photodiode 608 to incident light from different angles, by providing uniform diffraction of the incident light.

Figure 7:
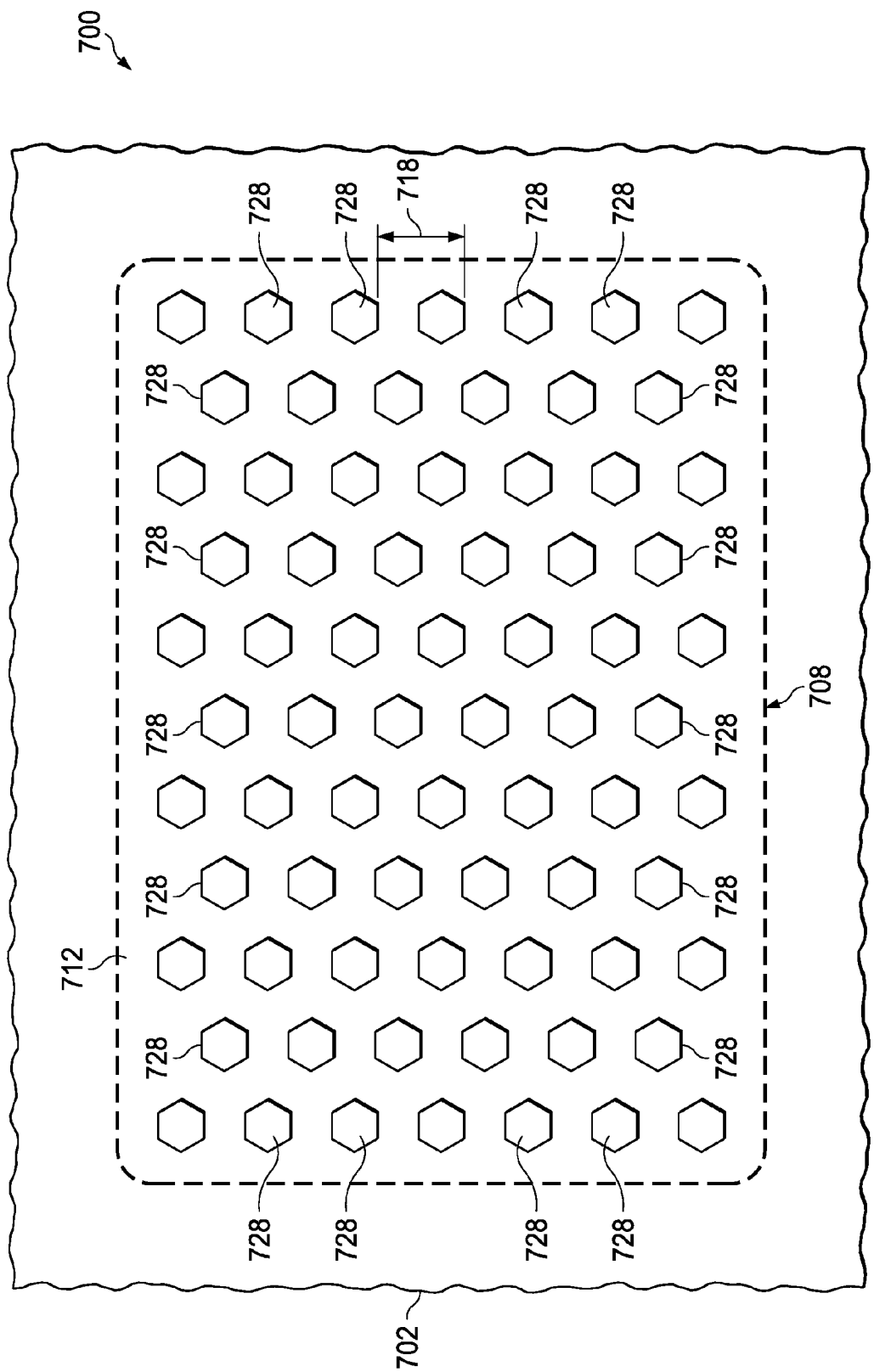

Referring to FIG. 7, a semiconductor device 700 is formed in and on a substrate 702 which includes semiconductor material extending to a top surface of the substrate 702, as described in reference to FIG. 1. A photodiode 708 is formed in the semiconductor material. A surface grating 712 is formed at the top surface of the substrate 702 over at least half of the photodiode 708. In the instant example, the surface grating 712 includes a hexagonal array 712. In one version of the instant example, the hexagonal array 712 may include discrete interference elements located at nodes 728 of the hexagonal array 712. The discrete interference elements may be field oxide elements or may be gate structures. In another version of the instant example, the hexagonal array 712 may include a hexagonal grid between the nodes 728 of the hexagonal array 712. The hexagonal grid may be a field oxide grid or may be a gate structure grid. In a further version of the instant example, the hexagonal array 712 may include discrete interference elements located at the nodes 728 and a hexagonal grid between the nodes 728. The discrete interference elements may be gate structures and the hexagonal grid may be field oxide, or vice versa. A pitch length 718 of the surface grating 712 is not more than 3 microns. In one version of the instant example, the pitch length 718 is not more than 2 microns. In a further version, the pitch length 718 is not more than 1 micron. Forming the surface grating 712 with a hexagonal array configuration may advantageously provide more uniform sensitivity of the photodiode 708 to incident light from different angles, by providing uniform diffraction of the incident light.

Figure 8:
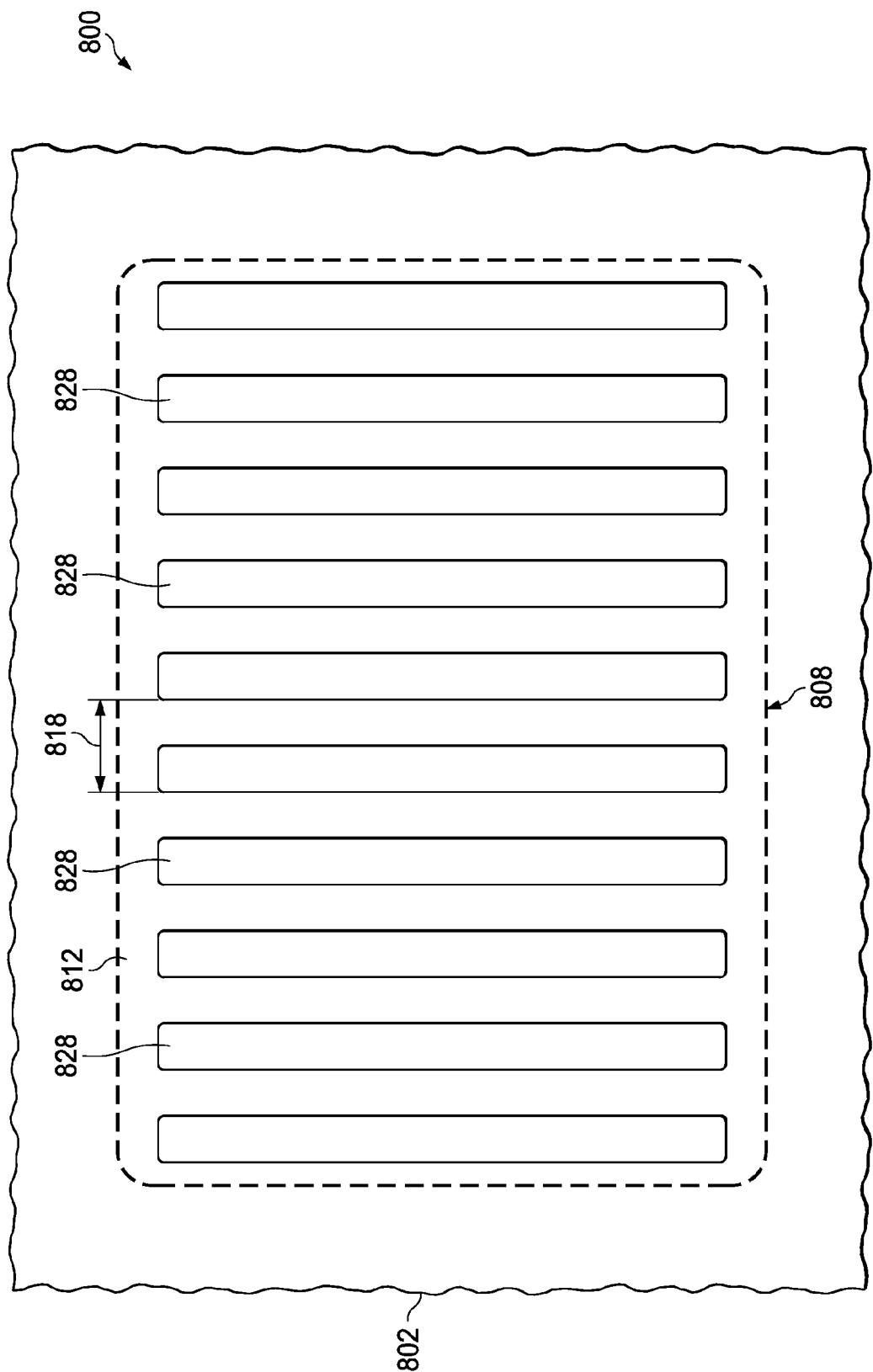

Referring to FIG. 8, a semiconductor device 800 is formed in and on a substrate 802 which includes semiconductor material extending to a top surface of the substrate 802, as described in reference to FIG. 1. A photodiode 808 is formed in the semiconductor material. A surface grating 812 is formed at the top surface of the substrate 802 over at least half of the photodiode 808. In the instant example, the surface grating 812 includes a linear array 812. In one version of the instant example, the linear array 812 may include discrete interference elements located at line elements 828 of the linear array 812. The discrete interference elements may be field oxide elements or may be gate structures. In another version of the instant example, the linear array 812 may include a linear grid between the line elements 828 of the linear array 812. The linear grid may be a field oxide grid or may be a gate structure grid. In a further version of the instant example, the linear array 812 may include discrete interference elements located at the line elements 828 and a grid between the line elements 828. The discrete interference elements may be gate structures and the hexagonal grid may be field oxide, or vice versa. A pitch length 818 of the surface grating 812 is not more than 3 microns. In one version of the instant example, the pitch length 818 is not more than 2 microns. In a further version, the pitch length 818 is not more than 1 micron. Forming the surface grating 812 with a linear array configuration may advantageously provide less reflection loss of incident light than from a two-dimension array due to more equal areas of the line elements 828 and spaces between the line elements 828.

Figure 9:
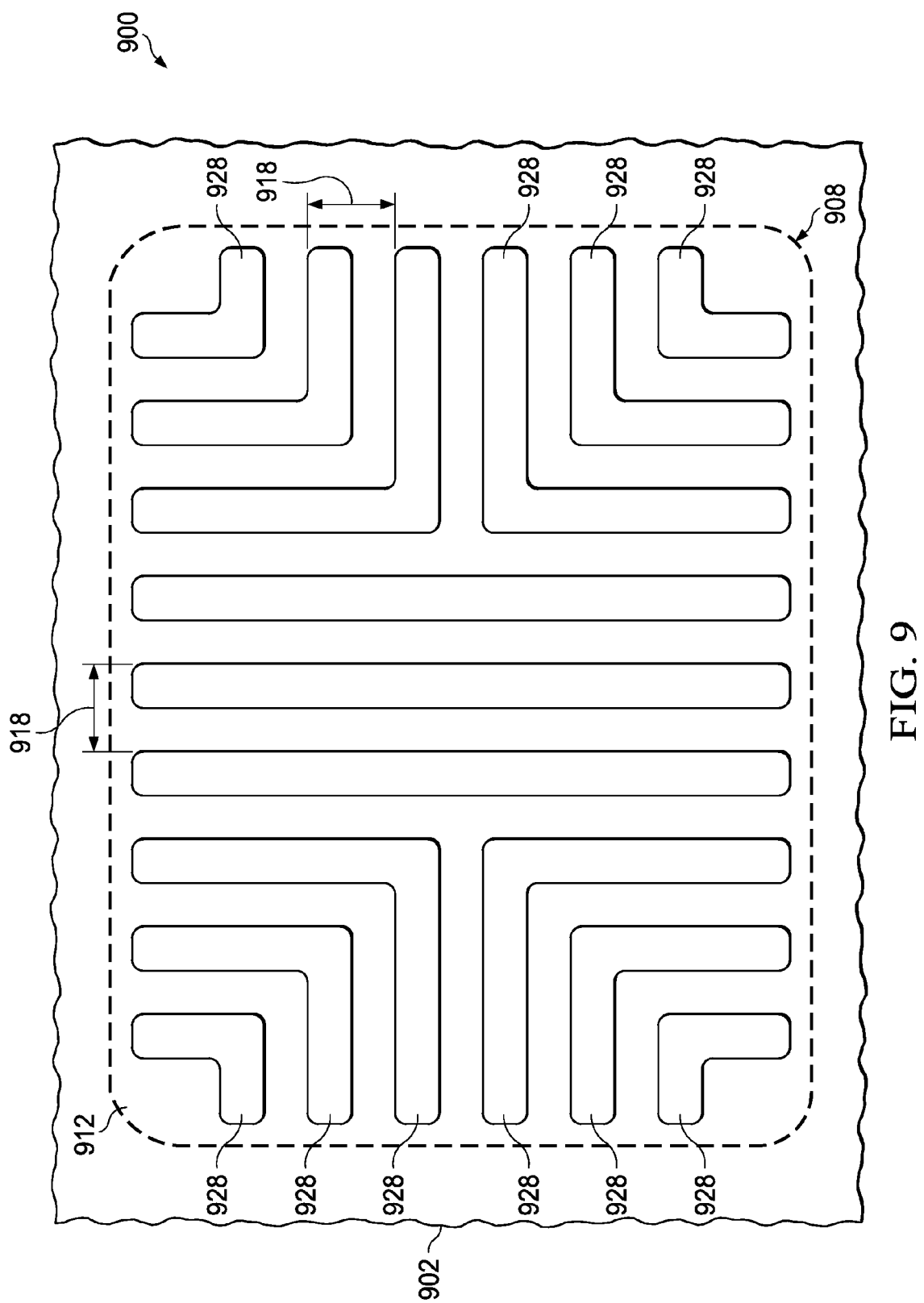

Referring to FIG. 9, a semiconductor device 900 is formed in and on a substrate 902 which includes semiconductor material extending to a top surface of the substrate 902, as described in reference to FIG. 1. A photodiode 908 is formed in the semiconductor material. A surface grating 912 is formed at the top surface of the substrate 902 over at least half of the photodiode 908. In the instant example, the surface grating 912 includes a peripherally perpendicular configuration of line elements 928, in which the line elements 928 are oriented perpendicular to a boundary of the photodiode 908 at the boundary. The line elements 928 may be straight or may have bends. The surface grating 912 may be any combination of field oxide and/or gate structures, discrete elements or grid, as described in reference to FIG. 5 and FIG. 6, with the peripherally perpendicular configuration. A pitch length 918 of the surface grating 912 is not more than 3 microns. In one version of the instant example, the pitch length 918 is not more than 2 microns. In a further version, the pitch length 918 is not more than 1 micron. Forming the surface grating 912 with a peripherally perpendicular configuration may advantageously provide less reflection loss of incident light than from a two-dimension array and may provide more uniform sensitivity of the photodiode 908 to incident light from different angles, by deducing diffraction of the incident light perpendicular to the boundary of the photodiode 908.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a substrate comprising a semiconductor material extending to a top surface of said substrate;
   a photodiode disposed in said substrate;
   a surface grating disposed at said top surface of said substrate over the photodiode, said surface grating comprising a plurality of alternating spaced apart field oxide elements disposed in the top surface of the substrate over the photodiode and a plurality of alternating spaced apart gate structures disposed on the top surface of the substrate over the photodiode therebetween, wherein only one gate structure is disposed between each pair of field oxide elements so that said surface grating covers more than half of said photodiode and a pitch length of said surface grating is no more than 3 microns.

2. The semiconductor device of claim 1, in which said surface grating comprises said field oxide elements and said field oxide elements have a shallow trench isolation (STI) configuration.

3. The semiconductor device of claim 1, in which said surface grating comprises said field oxide elements and said field oxide elements have a local oxidation of silicon (LOCOS) configuration.

4. The semiconductor device of claim 1, in which said surface grating comprises said gate structures and said gate structures have a layer of silicide block covering polysilicon gates of the gate structures.

5. The semiconductor device of claim 1, in which said surface grating comprises said field oxide elements and gate structures, and said gate structures are located on said semiconductor material of said substrate between said field oxide elements, wherein only one gate structure is disposed between each pair of field oxide elements.

6. The semiconductor device of claim 1, in which said surface grating comprises a two-dimensional array.

7. The semiconductor device of claim 6, in which said surface grating comprises a grid of exactly one of field oxide or gate structure, said grid being located between nodes of said two-dimensional array.

8. The semiconductor device of claim 1, in which said surface grating comprises a hexagonal array.

9. The semiconductor device of claim 1, in which said surface grating comprises a linear array of line elements.

10. The semiconductor device of claim 1, in which said surface grating comprises a peripherally perpendicular configuration of line elements.

11. A method of forming a semiconductor device, comprising the steps of:
    providing a substrate comprising a semiconductor material extending to a top surface of said substrate;
    forming a photodiode in said semiconductor material of said substrate;
    forming a plurality of alternating spaced apart elements of field oxide at said top surface of said substrate over the photodiode;
    forming a plurality of alternating spaced apart gate structures on said semiconductor material of said substrate over the photodiode and between the plurality of spaced apart elements of field oxide wherein only one gate structure is disposed between each pair of elements of field oxide, by a process comprising the steps of:
       forming a gate dielectric layer at said top surface of said substrate;
       forming gates of polysilicon over said gate dielectric layer; and
       forming a silicide block layer over said gates; and
    forming a surface grating at said top surface of said substrate, said surface grating comprising said plurality of alternating spaced apart field oxide elements and said plurality of alternating spaced apart gate structures, so that said surface grating covers more than half of said photodiode and a pitch length of said surface grating is no more than 3 microns.

12. The method of claim 11, in which said surface grating comprises said field oxide elements and said step of forming said field oxide elements is an STI process comprising the steps of:
    etching trenches into said substrate;
    growing thermal oxide on sidewalls of said trenches;
    filling said trenches with dielectric material; and
    removing said dielectric material from over said substrate using a chemical mechanical polish (CMP) process.

13. The method of claim 11, in which said surface grating comprises said field oxide elements and said step of forming said field oxide elements is a LOCOS process comprising the steps of:
    patterning a silicon nitride layer over said top surface of said substrate so as to expose areas for said field oxide elements;
    growing thermal oxide in said exposed areas; and
    removing said silicon nitride layer.

14. The method of claim 11, in which said surface grating comprises said gate structures and said step of forming said gate structures further comprises the step of forming a layer of silicide block over said gates of said gate structures.

15. The method of claim 11, in which said surface grating comprises said field oxide elements and gate structures, and said gate structures are formed on said semiconductor material of said substrate between said field oxide elements.

16. The method of claim 11, in which said surface grating comprises a two-dimensional array.

17. The method of claim 16, in which said surface grating comprises a grid of exactly one of field oxide or gate structure, said grid being located between nodes of said two-dimensional array.

18. The method of claim 11, in which said surface grating comprises a hexagonal array.

19. The method of claim 11, in which said surface grating comprises a linear array of line elements.

20. The method of claim 11, in which said surface grating comprises a peripherally perpendicular configuration of line elements.

* * * * *